United States Patent
Liu et al.

(10) Patent No.: US 12,490,611 B2
(45) Date of Patent: Dec. 2, 2025

(54) DISPLAY SUBSTRATE AND DISPLAY DEVICE

(71) Applicant: BOE TECHNOLOGY GROUP CO., LTD., Beijing (CN)

(72) Inventors: Libin Liu, Beijing (CN); Shiming Shi, Beijing (CN); Jiangnan Lu, Beijing (CN); Jianchao Zhu, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 95 days.

(21) Appl. No.: 17/753,393

(22) PCT Filed: Apr. 30, 2021

(86) PCT No.: PCT/CN2021/091497
§ 371 (c)(1),
(2) Date: Nov. 3, 2022

(87) PCT Pub. No.: WO2022/227004
PCT Pub. Date: Nov. 3, 2022

(65) Prior Publication Data
US 2024/0090290 A1    Mar. 14, 2024

(51) Int. Cl.
*H10K 59/131*    (2023.01)
*H10K 59/80*    (2023.01)

(52) U.S. Cl.
CPC ... *H10K 59/1315* (2023.02); *H10K 59/80522* (2023.02); *H10K 59/80515* (2023.02)

(58) Field of Classification Search
CPC ......... H10K 59/1315; H10K 59/80515; H10K 59/80522
See application file for complete search history.

(56) References Cited

U.S. PATENT DOCUMENTS

| | | | |
|---|---|---|---|
| 2007/0273305 | A1 | 11/2007 | Kubota |
| 2008/0191603 | A1* | 8/2008 | Kubota ............... H10K 50/824 |
| | | | 313/498 |
| 2010/0156273 | A1 | 6/2010 | Utsunomiya et al. |
| 2015/0008400 | A1 | 1/2015 | Kim |
| 2015/0137097 | A1 | 5/2015 | Choi et al. |
| 2018/0342569 | A1 | 11/2018 | Chen et al. |

(Continued)

FOREIGN PATENT DOCUMENTS

| | | |
|---|---|---|
| CN | 101047201 A | 10/2007 |
| CN | 103700675 A | 4/2014 |
| CN | 104282724 A | 1/2015 |

(Continued)

OTHER PUBLICATIONS

European Patent Office, Extended European Search Report Issued in Application No. 21938478.1, Nov. 23, 2023, Germany, 10 pages.

*Primary Examiner* — Daniel P Shook
(74) *Attorney, Agent, or Firm* — McCoy Russell LLP (57) ABSTRACT

A display substrate and a display device are provided, the display substrate includes: a substrate, and a power source layer, a conductive layer, and a cathode layer sequentially stacked on the substrate in a direction away from the substrate; the conductive layer includes first conductive patterns and second conductive patterns insulated from each other, the first conductive patterns are coupled to the power source layer, and the second conductive patterns are coupled to the cathode layer.

18 Claims, 7 Drawing Sheets

(56) References Cited

U.S. PATENT DOCUMENTS

| | | |
|---|---|---|
| 2022/0052139 A1 | 2/2022 | Xu |
| 2023/0102616 A1 | 3/2023 | Chen |

FOREIGN PATENT DOCUMENTS

| | | |
|---|---|---|
| CN | 107195660 A | 9/2017 |
| CN | 109166886 A | 1/2019 |
| CN | 110112205 A | 8/2019 |
| CN | 110728267 A | 1/2020 |
| CN | 211125656 U | 7/2020 |
| CN | 211150599 U | 7/2020 |
| CN | 111508978 A | 8/2020 |
| CN | 111627973 A | 9/2020 |
| CN | 112071206 A | 12/2020 |
| CN | 112289182 A | 1/2021 |
| EP | 3716335 A1 | 9/2020 |
| WO | 2021003600 A1 | 1/2021 |
| WO | 2021027216 A1 | 2/2021 |

\* cited by examiner

DISPLAY SUBSTRATE AND DISPLAY DEVICE

CROSS REFERENCE TO RELATED APPLICATION

The present application is a U.S. National Phase of International Application No. PCT/CN2021/091497 entitled "DISPLAY SUBSTRATE AND DISPLAY DEVICE," and filed on Apr. 30, 2021. The entire contents of the above-listed application are hereby incorporated by reference for all purposes.

TECHNICAL FIELD

The present disclosure relates to the technical field of display, and particularly to a display substrate and a display device.

BACKGROUND

With the development of display technology, the application range of display devices becomes wider and wider, and the performance requirements of display devices become higher and higher. As important indexes to measure the performance of display devices, power consumption and brightness long range uniformity of the display devices (Long Range Uniformity, LRU) have been paid more and more attention.

SUMMARY

The object of the present disclosure is to provide a display substrate and a display device.

In order to achieve the above object, the present disclosure provides the following technical solutions:
  a first aspect of the present disclosure provides a display substrate which includes: a substrate and a power source layer, a conductive layer, and a cathode layer which are sequentially stacked on the substrate in a direction away from the substrate;
  the conductive layer includes first conductive patterns and second conductive patterns insulated from each other, wherein the first conductive patterns are coupled to the power source layer and the second conductive patterns are coupled to the cathode layer.

Optionally, the conductive layer includes a plurality of first conductive patterns independent from each other, and the plurality of first conductive patterns are respectively coupled to the power source layer and the second conductive patterns are in a grid form.

Optionally, the plurality of first conductive patterns are divided into at least one row of first conductive patterns, each row of first conductive patterns include at least one first conductive pattern arranged in a first direction, the first conductive pattern include at least a portion extending in a second direction, and the second direction intersects the first direction.

Optionally, two adjacent rows of the first conductive patterns are staggered in the first direction.

Optionally, the first conductive patterns adjacent in the first direction have a first spacing region between them and the first conductive patterns adjacent in the second direction have a second spacing region between them, and the second conductive patterns include portions in the first spacing region and/or portions in the second spacing region.

Optionally, the second conductive patterns include a plurality of first sub-patterns and a plurality of second sub-patterns, wherein the first sub-patterns include the portion extending in the first direction and the second sub-patterns include the portion extending in the second direction;

The plurality of first sub-patterns are arranged in the second direction, and adjacent ones of the first sub-patterns are coupled with each other via at least one of the second sub-patterns.

Optionally, the plurality of second sub-patterns are divided into a plurality of rows of second sub-patterns, the first sub-patterns and a row of the second sub-patterns are alternatively arranged along the second direction, and the second sub-patterns are coupled with the adjacent first sub-patterns.

Optionally, the first sub-patterns include a portion located between two adjacent rows of first conductive patterns;
  in the plurality of second sub-patterns, the second sub-patterns described in the first part are located between the adjacent first conductive patterns in the first direction, and the second sub-patterns described in the second part are located between the adjacent first conductive patterns in the second direction.

Optionally, the first sub-patterns and a row of the first conductive patterns are alternatively arranged along the second direction.

Optionally, the plurality of first conductive patterns are divided into at least one column of first conductive patterns, each column of first conductive patterns include at least one of the first conductive patterns arranged along the second direction;
  the power supply layer includes a plurality of power supply lines arranged in the first direction, wherein the power supply lines include the portion extending in the second direction; and each column of the first conductive patterns include a respective one of the first conductive patterns coupled to a corresponding one of the power supply lines.

Optionally, the orthographic projection of the first conductive patterns on the substrate and the corresponding orthographic projection of the power supply lines on the substrate have a first overlap region, wherein the first conductive patterns are coupled to the corresponding power supply lines via at least one first via-hole, and the orthographic projection of the at least one first via-hole on the substrate is located in the first overlap region.

Optionally, the display substrate further includes an anode layer located between the conductive layer and the cathode layer, wherein the anode layer includes a plurality of anode patterns with an anode spacing region between adjacent anode patterns;
  The orthographic projection of the second conductive patterns on the substrate and the orthographic projection of the anode spacing region on the substrate have a second overlap region, wherein the second conductive patterns are coupled to the cathode layer through at least one second via-hole, the orthographic projection of the at least one second via-hole on the substrate is located in the second overlap region.

Optionally, the display substrate further includes the anode layer located between the conductive layer and the cathode layer, wherein the anode layer includes a first auxiliary connection pattern and a plurality of anode patterns, the anode spacing region is arranged between the adjacent anode patterns, the first auxiliary connection pattern is located in the anode spacing region, and the first auxiliary connection pattern is insulated from the anode patterns;

The second conductive patterns are coupled to the cathode layer through the first auxiliary connection pattern.

Optionally, the display substrate includes a display region and a peripheral region surrounding the display region; the anode layer further includes a second auxiliary connection pattern, wherein the second auxiliary connection pattern is located in the peripheral region;

the conductive layer further includes a third conductive pattern, wherein the third conductive pattern is located in the peripheral region; the third conductive pattern is coupled to the cathode layer through the second auxiliary connection pattern, and the third conductive pattern is further coupled to the second conductive pattern.

Optionally, the display substrate further includes a plurality of sub-pixel regions distributed in an array, a sub-pixel drive circuit is arranged in the sub-pixel region, and the plurality of sub-pixel regions are divided into a plurality of sub-pixel region rows and a plurality of sub-pixel region columns; each row of sub-pixel region rows includes the plurality of sub-pixel regions arranged along the first direction, and each sub-pixel region column includes the plurality of sub-pixel regions arranged along the second direction;

the plurality of first sub-patterns are in one-to-one correspondence with at least part of the sub-pixel region rows, and at least part of the first sub-patterns are located in the corresponding sub-pixel region rows.

Optionally, the plurality of first sub-patterns are in one-to-one correspondence with at least part of the odd rows of the sub-pixel region rows; or the plurality of first sub-patterns are in one-to-one correspondence with at least part of the even rows of sub-pixel region rows.

Optionally, the plurality of second sub-patterns are divided into a plurality of rows of second sub-patterns, the plurality of rows of second sub-patterns are in one-to-one correspondence with at least part of the sub-pixel region rows, and at least part of each second sub-pattern included in each row of second sub-patterns are located in the corresponding sub-pixel region rows.

Optionally, the plurality of rows of second sub-patterns are in one-to-one correspondence with at least part of the odd rows of sub-pixel region rows; or, the plurality of rows of the second sub-patterns are in one-to-one correspondence with at least part of the even rows of sub-pixel region rows.

Optionally, the plurality of second sub-patterns are divided into a plurality of columns of second sub-patterns, wherein the plurality of columns of second sub-patterns are in one-to-one correspondence with at least part of the sub-pixel region columns, and at least part of each second sub-pattern included in each column of second sub-patterns are located in the corresponding sub-pixel region columns.

Optionally, the plurality of columns of second sub-patterns are in one-to-one correspondence with at least part of the odd columns of sub-pixel region columns; or, the plurality of columns of the second sub-patterns are in one-to-one correspondence with at least part of the even columns of sub-pixel region columns.

Optionally, the plurality of first conductive patterns are divided into a plurality of rows of first conductive patterns, and the plurality of rows of first conductive patterns are in one-to-one correspondence with at least part of the sub-pixel region rows, and at least part of each first conductive pattern included in each row of first conductive patterns are located in the corresponding sub-pixel region rows.

Optionally, the plurality of rows of the first conductive patterns are in one-to-one correspondence with at least part of the odd rows of the sub-pixel region rows; or, the plurality of rows of the first conductive patterns are in one-to-one correspondence with at least part of the even rows of the sub-pixel region rows.

Optionally, the plurality of first conductive patterns are divided into a plurality of columns of first conductive patterns, and the plurality of columns of first conductive patterns are in one-to-one correspondence with at least part of the sub-pixel region columns, and at least part of each first conductive pattern included in each column of first conductive patterns is located in the corresponding sub-pixel region columns.

Optionally, the plurality of columns of first conductive patterns are in one-to-one correspondence with at least part of the odd columns of sub-pixel region columns; or, the plurality of columns of the first conductive patterns are in one-to-one correspondence with at least part of the even columns of the sub-pixel region columns.

Optionally, the display substrate further includes a thin film transistor array layer, wherein the thin film transistor array layer includes a thin film transistor, and the source electrode and the drain electrode of the thin film transistor are arranged in the same layer and are made of the same material as the power supply layer.

Based on the above-mentioned technical solutions of the display substrate, a second aspect of the present disclosure provides a display device which includes the above-mentioned display substrate.

BRIEF DESCRIPTION OF THE DRAWINGS

The drawings described herein are adopted to provide a further understanding to the disclosure and form a part of the disclosure. Schematic embodiments of the disclosure and descriptions thereof are adopted to explain the disclosure and not intended to form improper limits to the disclosure. In the drawings.

DETAILED DESCRIPTION

In order to further explain the display substrate and the display device provided by the embodiments of the present disclosure, detailed descriptions are give in the following in conjunction with the accompanying drawings.

The present disclosure provides a display substrate which includes: a substrate, a power source layer and a cathode layer which are stacked in sequence in a direction away from the substrate, wherein the power source layer is connected to a positive power supply signal VDD, the power source layer is made of a metal material, the cathode layer is connected to a negative power supply signal VSS, and the cathode layer is made of the metal material.

The power source layer is made of an aluminium alloy metal, and the square resistance is about 0.05 Ω/sq; the cathode layer is made of metal magnesium and/or metal aluminium, and the square resistance is about 10 Ω/sq-15 Ω/sq; therefore, compared with VDD, the voltage drop of the VSS is greater, resulting in a greater differential pressure between the VDD and the VSS, and power consumption is increased.

With reference to FIGS. 1-7, an embodiment of the present disclosure provides the display substrate which includes: a substrate 10 and a power source layer 20, a conductive layer 30, and a cathode layer 60 which are sequentially stacked on the substrate 10 in a direction away from the substrate 10;

the conductive layer 30 includes first conductive patterns 301 and second conductive patterns 302 insulated from each other, wherein the first conductive patterns 301 are coupled to the power source layer 20 and the second conductive patterns 302 are coupled to the cathode layer 60.

Figure 1:
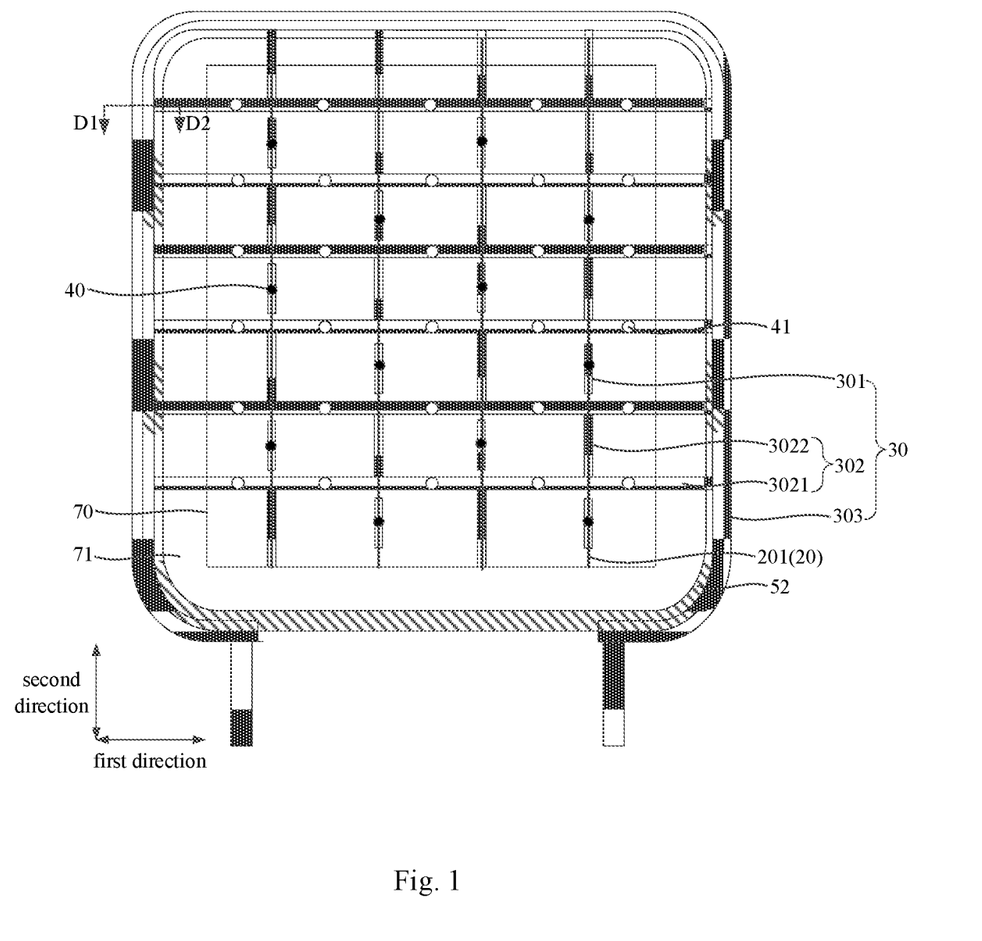
FIG. 1 is a schematic structural diagram of a display substrate according to an embodiment of the present disclosure.

For example, the display substrate includes a display region 70 and a peripheral region 71 which surrounds the display region 70.

For example, the display substrate includes an active layer, a first gate insulating layer, a first gate metal layer, a second gate insulating layer, a second gate metal layer, an interlayer insulating layer, a first source and drain metal layer, a first passivation layer, a first planarization layer, a second source and drain metal layer, a second passivation layer, a second planarization layer PLN2, an anode layer, a light-emitting functional layer EL, a cathode layer 60 and an encapsulation layer TFE which are sequentially stacked in a direction away from the base 10.

For example, the active layer, the first gate insulating layer, the first gate metal layer, the second gate insulating layer, the second gate metal layer, the interlayer insulating layer, and the first source drain metal layer are used to form a sub-pixel driving circuit layer in the display substrate.

For example, the first source and drain metal layer is used to form a data line in the display substrate, the power source layer 20, some conductive connection members, and a source electrode and a drain electrode included by the thin film transistor in the sub-pixel driving circuit layer.

For example, the second source and drain metal layer is used to form the conductive layer 30.

For example, the conductive layer 30 includes one or more first conductive patterns 301, wherein each first conductive patterns 301 connects in parallel with the power source layer 20.

For example, the second conductive patterns 302 are formed as an integrated structure. Spacing regions are provided between the second conductive patterns 302 and each of the first conductive patterns 301 to ensure insulation between the second conductive patterns 302 and the first conductive patterns 301 to prevent a short circuit between the cathode layer 60 and the power source layer 20.

For example, the power source layer 20 is used for transmitting a positive power signal, wherein the power source layer 20 includes a plurality of power connecting lines 201 arranged in a first direction, the power connecting lines 201 include portions extends in a second direction, and the second direction intersects the first direction. For example, the power source layer 20 further includes a plurality of power connecting lines including the portions extending in the first direction, wherein the power connecting lines are respectively coupled to the plurality of power connecting lines 201 so that the power source layer 20 is in a grid form. For example, the power connecting lines are made of the second gate metal layer. For example, the first conductive patterns 301 are connected in parallel with the power connecting lines 201.

It can be seen from the above-mentioned specific structure of the display substrate that in the display substrate provided by the embodiments of the present disclosure, the conductive layer 30 is provided between the power source layer 20 and the cathode layer 60, and the conductive layer 30 includes the first conductive patterns 301 and the second conductive patterns 302 which are insulated from each other. By arranging that the first conductive patterns 301 in the conductive layer 30 are coupled to the power source layer 20, the IR-drop of the positive power signal transmitted by the power source layer 20 is effectively reduced, which ensures a better LRU effect. By arranging that the second conductive patterns 302 in the conductive layer 30 are coupled to the cathode layer 60 such that the second conductive patterns 302 act as an auxiliary cathode, the resistance of the cathode layer 60 is effectively reduced, which reduces the power consumption of the display substrate. Therefore, the display substrate provided by the embodiments of the present disclosure ensures that the display substrate has the better LRU effect while reducing the power consumption of the display substrate by rationally distributing the conductive layer 30.

With reference to FIGS. 1 to 7, in some embodiments, the conductive layer 30 includes the plurality of first conductive patterns 301 independent from each other, wherein the plurality of first conductive patterns 301 are respectively coupled to the power layer 20 and the second conductive patterns 302 are in the grid form.

For example, the plurality of first conductive patterns 301 are distributed in an array, and each of the first conductive patterns 301 is connected in parallel with the power source layer 20.

For example, the second conductive pattern 302 is in the grid form, at least a part of the first conductive patterns 301 are located in the grid formed by the second conductive patterns 302, and/or at least a part of the first conductive patterns 301 are located outside the grid formed by the second conductive patterns 302, which are insulated from each of the first conductive patterns 301.

For example, the second conductive patterns 302 are coupled to the cathode layer 60 at a plurality of locations.

For example, taking the display substrate with a size of 17.3 inches as an example (resolution is 1920*2560), the voltage drop generated by the power layer 20 is only 0.2 V and the voltage drop generated by the cathode layer 60 is only 0.3 V, and compared with a regular scheme, power consumption is reduced by 26%.

The above-mentioned conductive layer 30 is provided to include the plurality of first conductive patterns 301 which are independent from each other, and the second conductive patterns 302 are in the grid form, so that the first conductive patterns 301 and the second conductive patterns 302 can be arranged in an appropriate proportion to balance the voltage drop generated on the power source layer 20 and the cathode layer 60 so as to achieve the optimization of LRU effects and reducing the power consumption. Also, the above-described sectional design of the plurality of first conductive patterns 301 allows more flexibility in the layout of the plurality of first conductive patterns 301, thereby effectively reducing the layout difficulty of the first conductive patterns 301 and the second conductive patterns 302.

With reference to FIGS. 1 to 7, in some embodiments, the plurality of first conductive patterns 301 are arranged to be divided into at least one row of first conductive patterns 301, each row of first conductive patterns 301 include at least one first conductive pattern 301 arranged along the first direction, the first conductive patterns 301 include at least portions extending along the second direction, and the second direction intersects the first direction.

For example, the plurality of first conductive patterns 301 are divided into the plurality of rows of first conductive patterns 301, each row of first conductive patterns 301 include the plurality of the first conductive patterns 301 arranged in the first direction.

For example, the first direction includes a horizontal direction and the second direction includes a vertical direction.

For example, the display substrate includes the sub-pixel regions in which sub-pixel drive circuits are arranged. For example, the length of the first conductive patterns 301 in the second direction is less than or equal to the length of the sub-pixel region in the second direction. For example, the length of the first conductive patterns 301 in the second direction is greater than the length of the sub-pixel region in the second direction.

For example, the orthographic projection of the first conductive patterns 301 on the substrate 10 is in the orthographic projection of the power source layer 20 on the substrate 10.

For example, the plurality of first conductive patterns 301 are uniformly distributed throughout the display region 70 of the display substrate.

The above-mentioned arrangement enables the parts of the power supply layer 20 coupled with the first conductive patterns 301 to be uniformly distributed, which can better reduce the IR-drop generated on the power supply layer 20 and effectively improve the LRU effect of the display substrate.

With reference to FIGS. 1-7, in some embodiments, two adjacent rows of first conductive patterns 301 are staggered in the first direction.

The above arrangement increases the distance between two of the first conductive patterns 301 adjacent in the second direction to provide more space for the layout of the second conductive patterns 302, thereby better reducing the difficulty of the layout of the first conductive patterns 301 and the second conductive patterns 302.

With reference to FIGS. 1 to 7, in some embodiments, the first conductive patterns 301 adjacent in the first direction have the first spacing region between them and the first conductive patterns 301 adjacent in the second direction have the second spacing region between them, and the second conductive patterns 302 include portions in the first spacing region and/or portions in the second spacing region.

For example, a minimum width of the first spacing region in the first direction is greater than or equal to a width of the sub-pixel region in the first direction. For example, the minimum width of the first spacing region in the first direction is equal to the width of two of the sub-pixel regions in the first direction.

For example, the width of the second spacing region in the second direction is greater than or equal to the width of the sub-pixel region in the second direction.

The above embodiment provides the display substrate in which the plurality of first conductive patterns 301 and the plurality of second conductive patterns 302 can be uniformly distributed with each other by providing that the second conductive patterns 302 include the portions in the first spacing region and/or the portions in the second spacing region, so that not only the IR-drop generated on the power source layer 20 can be better reduced, the LRU effect of the display substrate can be effectively improved, but also the power consumption of the display substrate can be more effectively reduced.

With reference to FIGS. 1 to 7, in some embodiments, the second conductive patterns 302 include a plurality of first sub-patterns 3021 which include the portions extending in the first direction and a plurality of second sub-patterns 3022 which include the portions extending in the second direction. The plurality of first sub-patterns 3021 are arranged in the second direction, and adjacent first sub-patterns 3021 are coupled with each other through at least one of the second sub-patterns 3022.

For example, the plurality of first sub-patterns 3021 and the plurality of second sub-patterns 3022 are formed in an integrated structure.

For example, the length of the first sub-patterns 3021 in the first direction is greater than the length of the display region 70 in the first direction. For example, both ends of the first sub-patterns 3021 are located in the peripheral region 71 of the display substrate.

For example, the plurality of first sub-patterns 3021 are arranged along the second direction, and the minimum distance between two adjacent first sub-patterns 3021 in the second direction is greater than or equal to the width of the sub-pixel region in the second direction. For example, the minimum distance between two adjacent first sub-patterns 3021 in the second direction is smaller than the width of the sub-pixel region in the second direction.

For example, the length of the second sub-patterns 3022 in the second direction is greater than or equal to the width of the sub-pixel region in the second direction. For example, the length of the second sub-patterns 3022 in the second direction is less than the width of the sub-pixel region in the second direction.

For example, at least a portion of the second sub-patterns 3022 can extend from the display region 70 to the peripheral region 71 of the display substrate.

For example, the first sub-patterns 3021 are coupled to the cathode layer 60 and/or the second sub-patterns 3022 are coupled to the cathode layer 60.

The above-mentioned arrangement of the second conductive patterns 302 which include the plurality of first sub-patterns 3021 and the plurality of second sub-patterns 3022 enables the cathode layer 60 to be coupled with the second conductive patterns 302 at the plurality of positions to achieve uniform compensation for the cathode layer 60, thereby more effectively reducing the resistance of the cathode layer 60 and reducing the power consumption of the display substrate.

With reference to FIGS. 1 to 7, in some embodiments, the plurality of second sub-patterns 3022 are arranged to be divided into the plurality of rows of second sub-patterns 3022, the first sub-patterns 3021 are alternately arranged with the row of second sub-patterns 3022 along the second direction, and the second sub-patterns 3022 are coupled with the adjacent first sub-patterns 3021.

The above-mentioned arrangement enables the mesh formed by the second conductive patterns 302 to be uniformly distributed, so that not only uniform compensation for the cathode layer 60 can be achieved, the resistance of the cathode layer 60 is effectively reduced, and the power consumption of the display substrate is reduced, but it is also beneficial to reduce the layout difficulty of the conductive layer 30 as a whole.

With reference to FIGS. 1 to 7, in some embodiments, the first sub-patterns 3021 include the portions between two adjacent rows of the first conductive patterns 301, in the plurality of second sub-patterns 3022, the second sub-patterns described in the first part are located between the adjacent first conductive patterns 301 in the first direction, and the second sub-patterns described in the second part are located between the adjacent first conductive patterns 301 in the second direction.

For example, the second sub-patterns 3022 and the first conductive patterns 301 are alternatively arranged along the first direction.

For example, two adjacent rows of first conductive patterns 301 are separated by at least one of the first sub-patterns 3021.

The above-mentioned arrangement enables the plurality of first conductive patterns 301 and the second conductive patterns 302 are uniformly distributed with each other, so that not only the IR-drop generated on the power supply layer 20 can be better reduced, the LRU effect of the display substrate can be effectively improved, but also the power consumption of the display substrate can be more effectively reduced.

With reference to FIGS. 1 to 7, in some embodiments, the first sub-patterns 3021 and the row of the first conductive patterns 301 are staggered in the second direction.

The above-mentioned arrangement enables the plurality of first conductive patterns 301 and the second conductive patterns 302 are uniformly distributed with each other, so that not only the IR-drop generated on the power supply layer 20 can be better reduced, the LRU effect of the display substrate can be effectively improved, but also the power consumption of the display substrate can be more effectively reduced.

With reference to FIGS. 1 to 7, in some embodiments, the plurality of first conductive patterns 301 are divided into at least one column of first conductive patterns 301, each column of first conductive patterns 301 include at least one of the first conductive patterns 301 arranged along the second direction;

the power supply layer 20 includes the plurality of power supply lines 201 arranged in the first direction, wherein the power supply lines 201 include the portion extending in the second direction; each column of the first conductive patterns 301 include a respective one of the first conductive patterns 301 coupled to the corresponding one of the power supply lines 201.

For example, the plurality of first conductive patterns 301 are divided into the plurality of columns of first conductive patterns 301, each column of first conductive patterns 301 include the plurality of the first conductive patterns 301 arranged in the second direction.

For example, the plurality of columns of the first conductive patterns 301 are in one-to-one correspondence with the plurality of power supply lines 201, and each column of the first conductive patterns 301 include the respective one of the first conductive patterns 301 in parallel with the corresponding one of the power supply lines 201.

For example, the plurality of sub-pixel regions in the display substrate are divided into the plurality of column sub-pixel regions, and the plurality of column sub-pixel regions are in one-to-one correspondence with the plurality of power supply lines 201, and at least part of the power supply lines 201 are located in the corresponding column sub-pixel region.

For example, the plurality of sub-pixels in the display substrate are divided into the plurality of pixel unit regions, each pixel unit region includes at least two sub-pixel regions, the plurality of pixel unit regions are divided into the plurality of columns of pixel unit regions, the plurality of columns of pixel unit regions are in one-to-one correspondence with the plurality of power supply lines 201, and at least part of the power supply lines 201 are located in the corresponding column of pixel unit regions.

In the display substrate provided in the above-mentioned embodiment, by arranging that each column of the first conductive patterns 301 include the first conductive patterns 301 respectively coupled with the corresponding one of the power supply lines 201, so that the portions of the power supply layer 20 coupled with the first conductive patterns 301 are uniformly distributed, the IR-drop generated on the power supply layer 20 can be better reduced, and the LRU effect of the display substrate can be effectively improved.

With reference to FIGS. 1-7, in some embodiments, the orthographic projection of the first conductive patterns 301 on the substrate 10 and the corresponding orthographic projection of the power lines 201 on the substrate 10 have the first overlap region, the first conductive patterns 301 are coupled to the corresponding power lines 201 through at least one first via-hole 40, the orthographic projection of the at least one first via-hole 40 on the substrate 10 is located in the first overlap region.

For example, the orthographic projection of the first conductive patterns 301 on the substrate 10 and the corresponding orthographic projection of the power lines 201 on the substrate 10 have the first overlap region extending in the second direction.

For example, the first conductive patterns 301 and the power lines 201 have a first passivation layer and a first planarization layer between them, and the first via-hole 40 extends through the first passivation layer and the first planarization layer.

For example, the first conductive patterns 301 are connected in parallel with the corresponding power lines 201 through two of the first via-holes 40.

With reference to FIGS. 1-7, in some embodiments, the display substrate further includes an anode layer between the conductive layer 30 and the cathode layer 60, wherein the anode layer includes a plurality of anode patterns 50 independent from each other, and adjacent anode patterns 50 have anode spacing region between them;

The orthographic projection of the second conductive patterns 302 on the substrate 10 and the orthographic projection of the anode spacing region on the substrate 10 have a second overlap region, the second conductive patterns 302 are coupled to the cathode layer 60 by at least one second via-hole 41, the orthographic projection of the at least one second via-hole 41 on the substrate 10 is located in the second overlap region.

For example, at least the second planarization layer PLN2, a pixel definition layer PDL, a common layer among light-emitting functional layer including an electron injection layer, an electron transport layer, a hole transport layer, a hole injection layer, and the like are provided between the second conductive patterns 302 and the cathode layer 60. The second via-holes 41 extend through the second planar layer PLN2, the pixel definition layer PDL, and the common layer.

For example, an overlapping hole between the cathode layer 60 and the second conductive pattern 302 is formed by using a Lift off process.

As shown in FIGS. 9a to 9e, in more detail, a second source and drain metal layer, a second planarization layer PLN2, an anode layer, a pixel definition layer PDL, and a spacing region layer PS are sequentially manufactured, and a via-hole capable of exposing the second conductive patterns 302 is formed on the second planarization layer PLN2 and the pixel definition layer PDL. Then, a stripping layer 80 with the inverted trapezoidal structure is formed through a process of deposition, exposure, etching, etc. successively. For example, the stripping layer 80 is made of a negative organic material. then, evaporation is continued to form a light-emitting functional layer, and the light-emitting functional layer is broken at the side surface of the stripping layer 80, and finally the display substrate is immersed in a stripping solution, and is taken out after standing for 0.5 min-2 min, the display substrate is tilted, and the stripping layer 80 can remove the light-emitting functional layer above the display substrate to form overlapping holes of the cathode layer 60 and the second conductive patterns 302. For example, the stripping layer 80 and the stripping solution are selected from materials having no effect on the light-emitting functional layer. For example, a fluoroether solvent is used as the stripping solution. Finally, the cathode layer 60 is formed by evaporation, so that the cathode layer 60 laps the second conductive patterns 302.

For example, the first sub-patterns 3021 in the second conductive patterns 302 are coupled to the cathode layer 60 through at least one second via-hole 41. For example, the second sub-patterns 3022 in the second conductive patterns 302 are coupled to the cathode layer 60 through at least one second via-hole 41.

The orthographic projection of at least one second via-hole 41 on the substrate 10 is located in the second overlap region, while ensuring that the cathode layer 60 is coupled to the second conductive patterns 302 through the second via-hole 41, the short circuit phenomenon occurs between the cathode layer 60 and the second conductive patterns 302 and the anode layer can be avoided.

Figure 4:
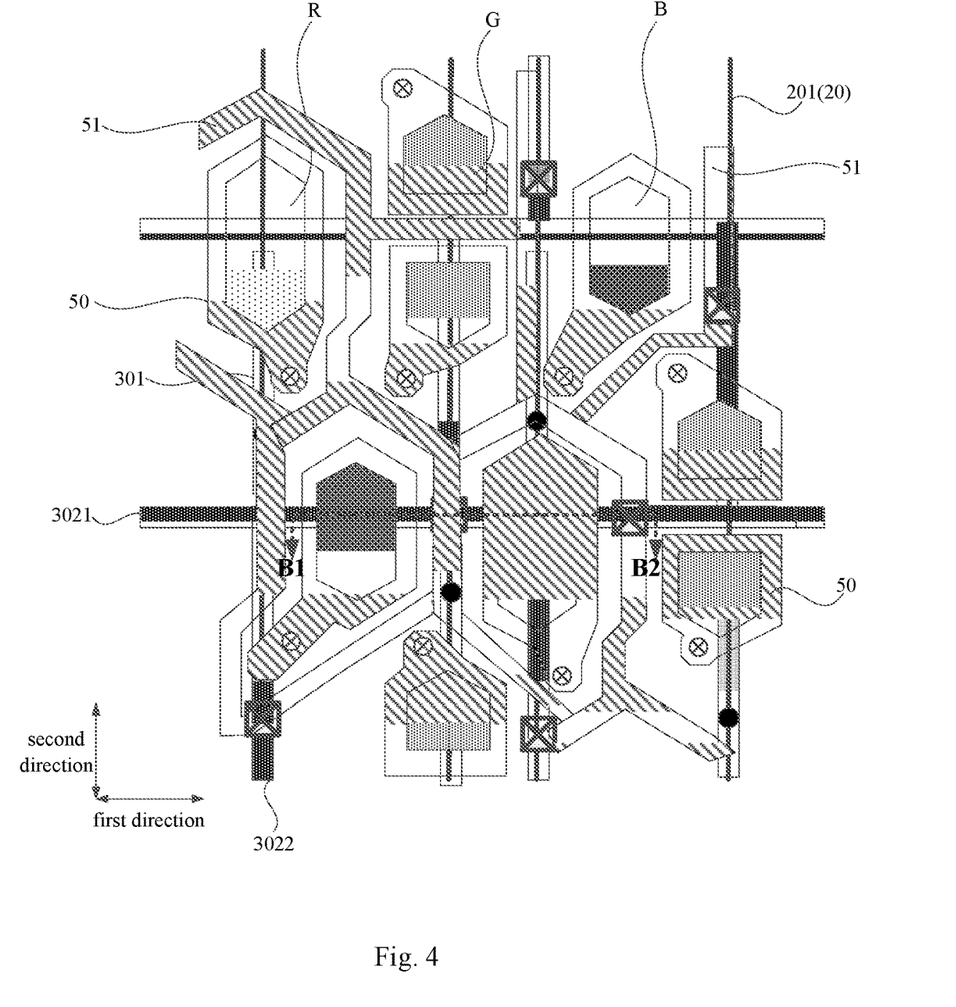
FIG. 4 is a schematic layout diagram of a power layer, a conductive layer, and a first auxiliary connection pattern in a display region according to an embodiment of the present disclosure.
Figure 5:
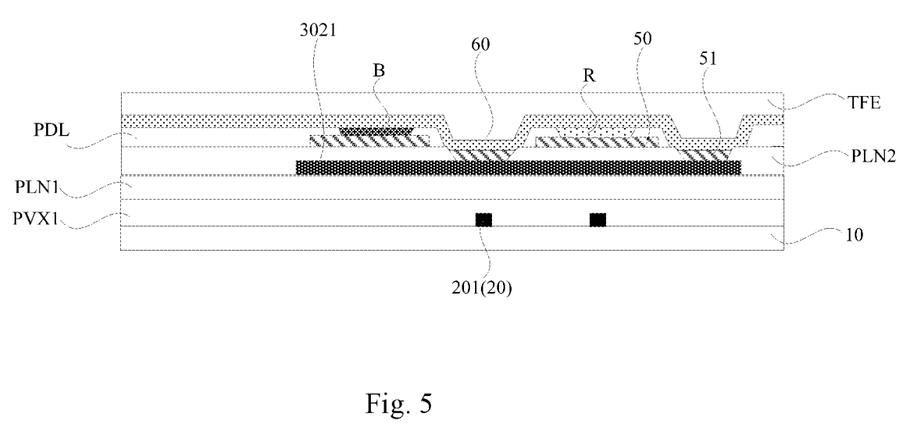
FIG. 5 is a schematic cross-sectional diagram along the direction B1B2 in FIG. 4.

As shown in FIGS. 4 and 5, in some embodiments, the display substrate further includes the anode layer between the conductive layer 30 and the cathode layer 60, wherein the anode layer includes a first auxiliary connection pattern 51 and a plurality of anode patterns 50, an anode spacing region is arranged in front of the adjacent anode patterns 50, the first auxiliary connection pattern 51 is located in the anode spacing region, and the first auxiliary connection pattern 51 is insulated from the anode patterns 50, and the second conductive patterns 302 are coupled to the cathode layer 60 through the first auxiliary connection pattern 51.

For example, the orthographic projection of the first auxiliary connection pattern 51 on the substrate 10 and the orthographic projection of the second conductive pattern 302 on the substrate 10 have overlapping regions, and the orthographic projection of the first auxiliary connection pattern 51 on the substrate 10 and the orthographic projection of the cathode layer 60 on the substrate 10 have overlapping regions.

For example, the first auxiliary connection pattern 51 is coupled to the second conductive patterns 302 through the via-holes, and the first auxiliary connection pattern 51 is coupled to the cathode layer 60 through the via-holes.

The above-mentioned arrangement that the anode layer includes the first auxiliary connection pattern 51 and the anode patterns 50 enables that the first auxiliary connection pattern 51 and the anode patterns 50 can be formed in the same patterning process without increasing the number of patterning times.

The above-mentioned arrangement that the second conductive patterns 302 are coupled to the cathode layer 60 via the first auxiliary connection pattern 51 not only ensures the connection performance between the second conductive patterns 302 and the cathode layer 60, but also further reduces the voltage drop generated on the cathode layer 60, thereby better reducing the power consumption of the display substrate.

Figure 8:
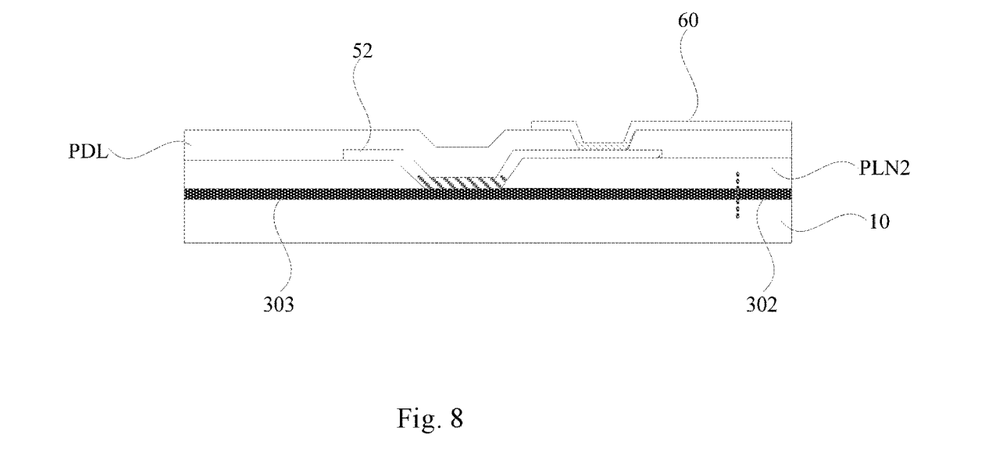
FIG. 8 is a schematic cross-sectional diagram along the direction D1D2 in FIG. 1.
Figure 9A:
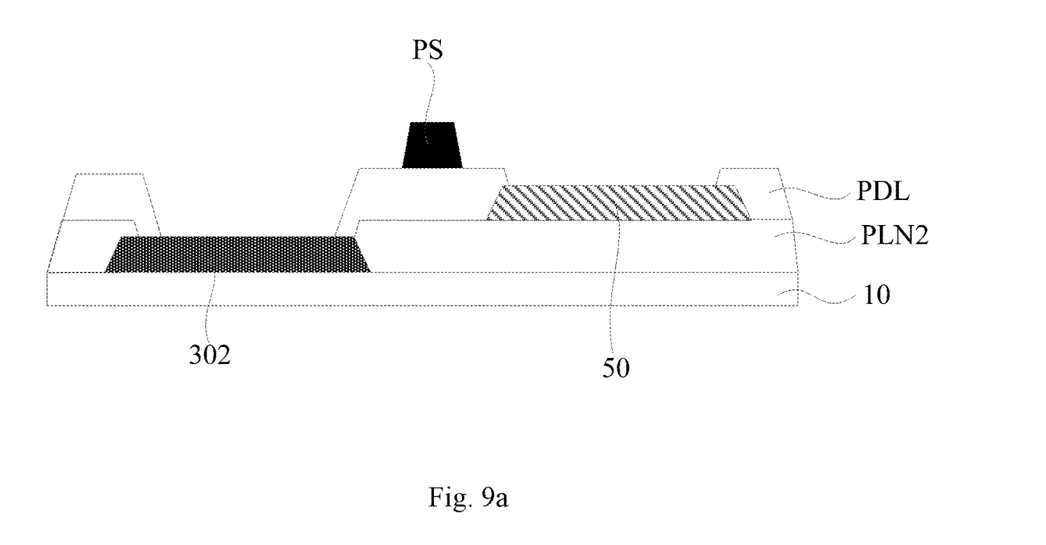
FIGS. 9a-9e are process flow diagrams for connecting a cathode layer to a second conductive pattern according to an embodiment of the present disclosure.
Figure 9B:
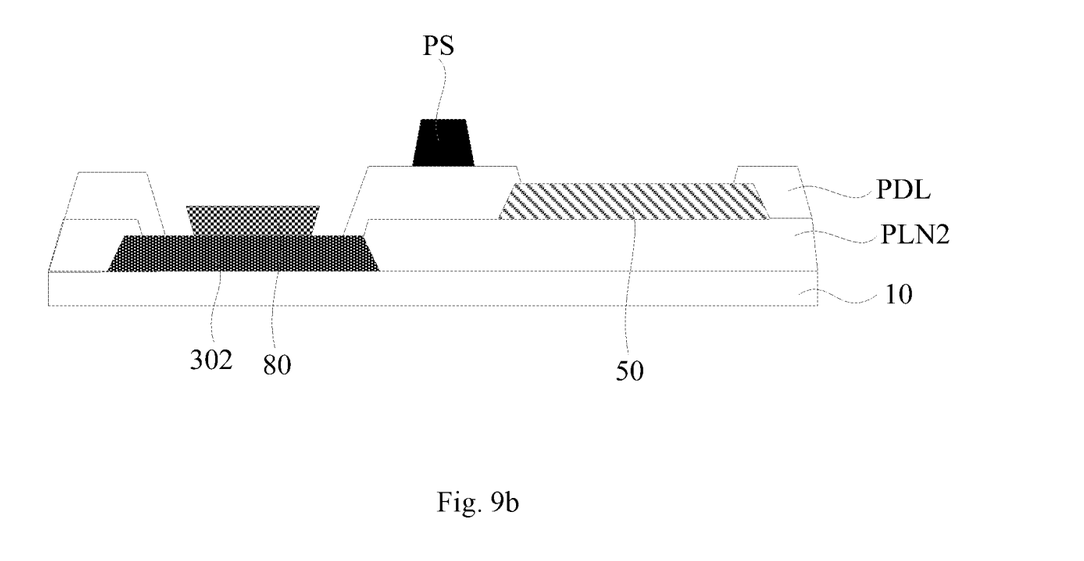
Figure 9C:
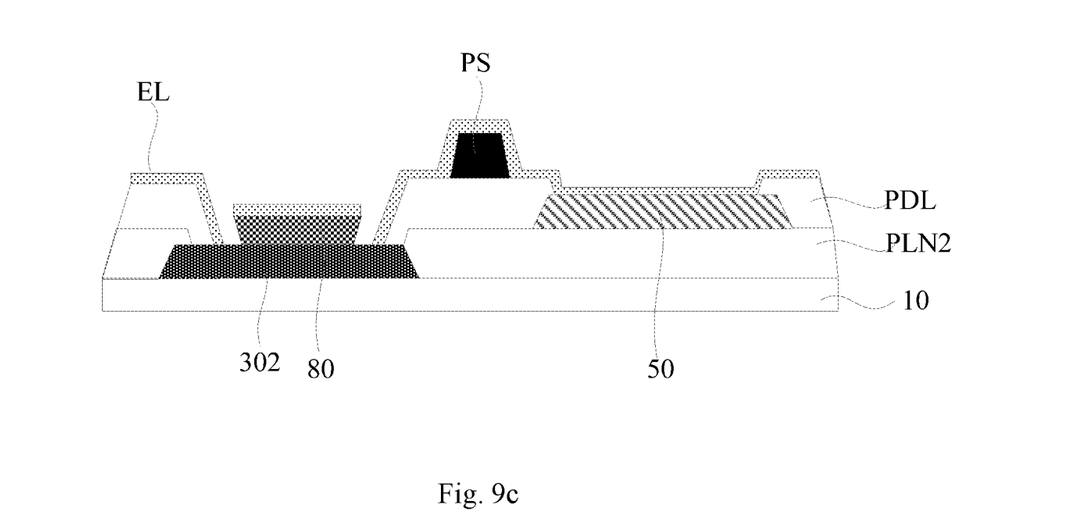
Figure 9D:
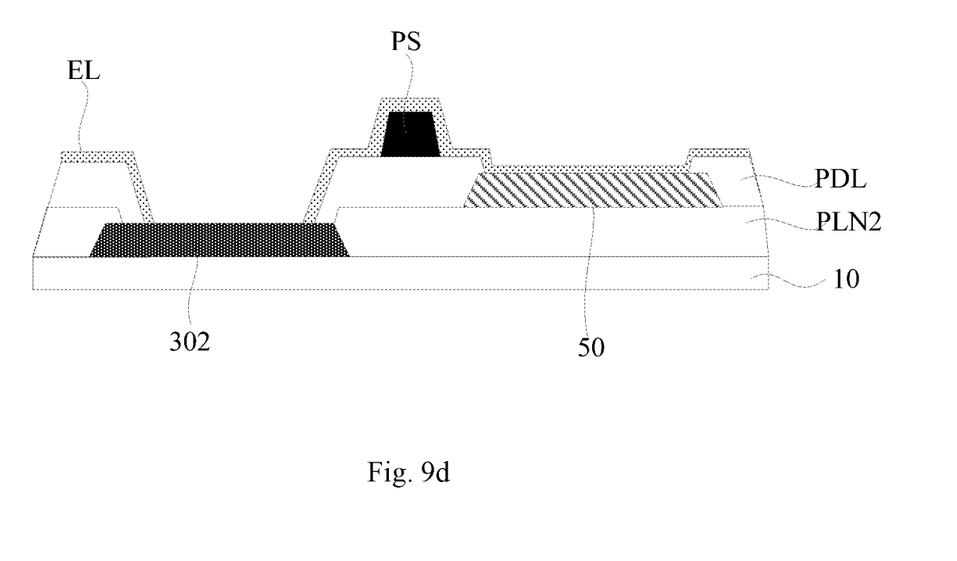
Figure 9E:
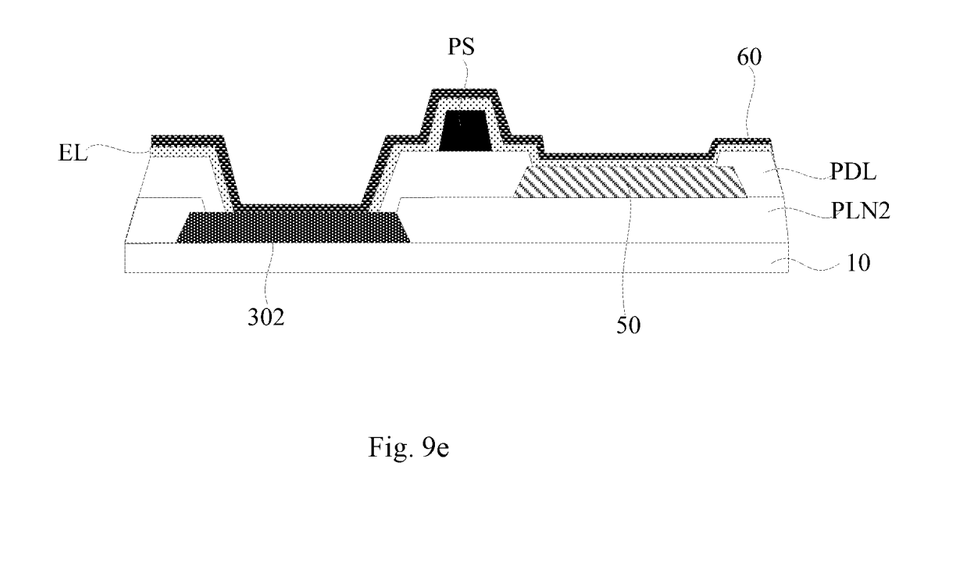

As shown in FIGS. 1 and 8, in some embodiments, the display substrate includes a display region 70 and a peripheral region 71 surrounding the display region 70; the anode layer further includes a second auxiliary connection pattern 52, wherein the second auxiliary connection pattern 52 is located in the peripheral region 71;

the conductive layer 30 further includes a third conductive pattern 303, wherein the third conductive pattern 303 is located in the peripheral region 71, the third conductive pattern 303 is coupled to the cathode layer 60 through the second auxiliary connection pattern 52, and the third conductive patterns 303 are further coupled to the second conductive patterns 302.

For example, the second auxiliary connection pattern 52 surrounds the display region 70. The second auxiliary connection pattern 52 is formed in the same patterning process as the anode pattern 50.

For example, the orthographic projection of the second auxiliary connection pattern 52 on the substrate 10 and the orthographic projection of the third conductive patterns 303 on the substrate 10 have the overlapping region where the second auxiliary connection pattern 52 and the third conductive patterns 303 are coupled. The orthographic projection of the second auxiliary connection pattern 52 on the substrate 10 and the orthographic projection of the cathode layer 60 on the substrate 10 have the overlapping region where the second auxiliary connection pattern 52 and the cathode layer 60 are coupled.

For example, the third conductive patterns 303 are coupled to the first sub-patterns 3021 of the second conductive patterns 302 and the third conductive patterns 303 are coupled to the second sub-patterns 3022 of the second conductive patterns 302. For example, the third conductive patterns 303 and the second conductive patterns 302 form the integral structure.

For example, the third conductive patterns 303 are coupled to a driver chip in the display substrate, capable of receiving a negative power signal from the driver chip.

The above-mentioned arrangement of the second auxiliary connection pattern 52 and the third conductive patterns 303 in the peripheral region 71 not only ensures the connection performance between the second conductive patterns 302 and the cathode layer 60, but also further reduces the voltage drop generated on the cathode layer 60, thereby better reducing the power consumption of the display substrate.

Figure 2:
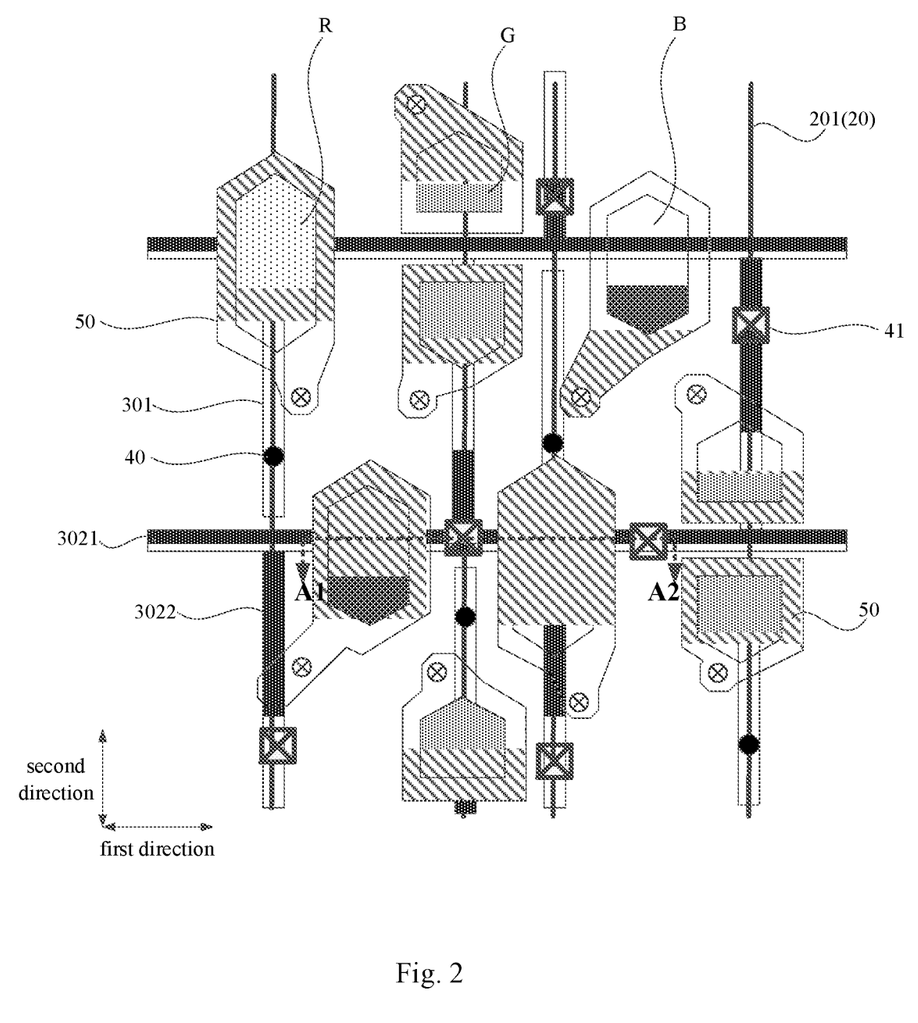
FIG. 2 is a schematic diagram of a first layout of a power layer and a conductive layer in a display region according to an embodiment of the present disclosure.
Figure 3:
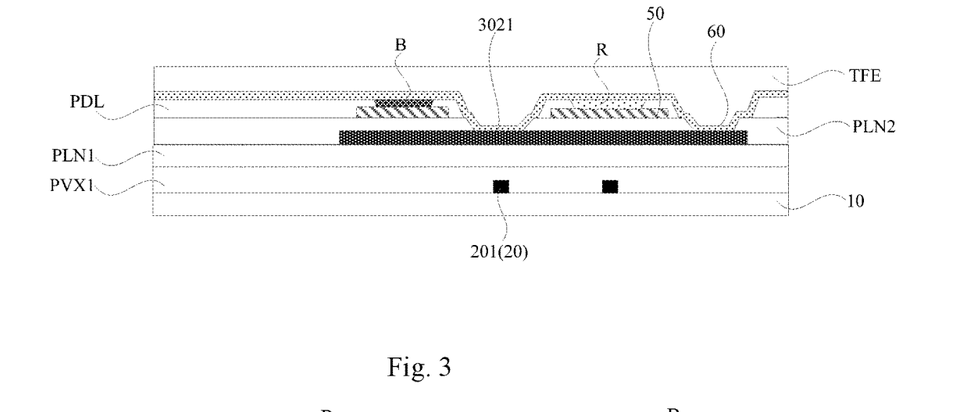
FIG. 3 is a schematic cross-sectional diagram along the direction A1A2 in FIG. 2.
Figure 6:
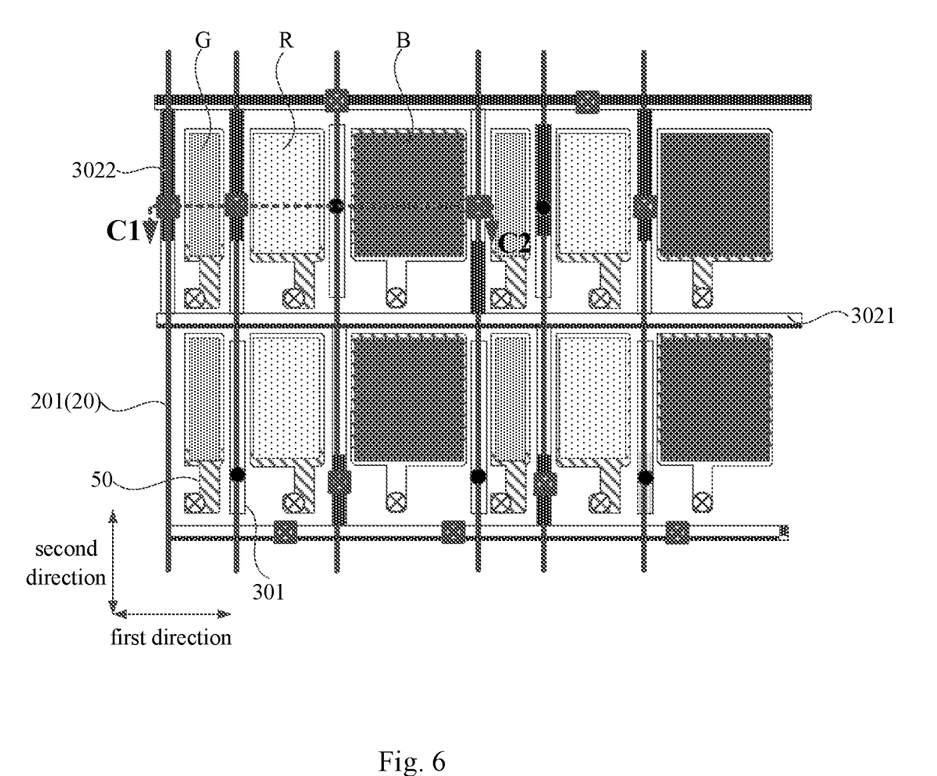
FIG. 6 is a schematic diagram of a second layout of a power layer and a conductive layer in a display region according to an embodiment of the present disclosure.
Figure 7:
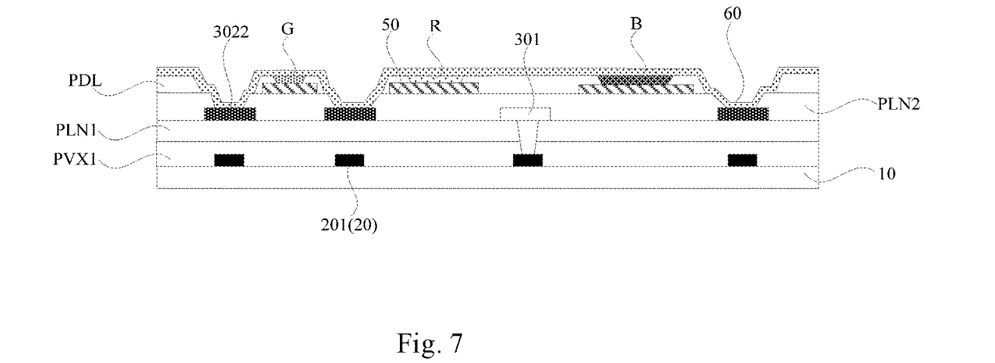
FIG. 7 is a schematic cross-sectional diagram along the direction C1C2 in FIG. 6.

It should be noted that other film layers between the substrate 10 and the power layer 20 are not shown in FIGS. 3, 5, and 7. In FIGS. 8, 9a to 9e, other film layers between the substrate 10 and the conductive layer are not shown. In FIGS. 2, 4, and 6, a red sub-pixel R, a green sub-pixel G, and a blue sub-pixel B are also shown.

In some embodiments, the display substrate further includes the plurality of sub-pixel regions distributed in the array, the sub-pixel drive circuit is arranged in the sub-pixel region, and the plurality of sub-pixel regions are divided into the plurality of sub-pixel region rows and the plurality of sub-pixel region columns; each row of sub-pixel region rows include the plurality of sub-pixel regions arranged along the first direction, and each column of spacing region columns includes the plurality of sub-pixel regions arranged along the second direction; the plurality of first sub-patterns 3021 are in one-to-one correspondence with at least part of the sub-pixel region rows, and at least part of the first sub-patterns 3021 are located in corresponding sub-pixel region rows.

For example, the plurality of sub-pixel region rows can be divided into the plurality of rows of sub-pixel region rows arranged in the second direction and can also be divided into the plurality of columns of sub-pixel region columns arranged in the first direction. For example, the plurality of first sub-patterns 3021 are in one-to-one correspondence with the plurality rows of sub-pixel region rows, and at least part of the first sub-patterns 3021 are located in the corresponding sub-pixel region rows, and the arrangement is such that the first sub-patterns 3021 are arranged in each row of sub-pixel regions.

The above-mentioned arrangement are beneficial to the uniform layout of the second conductive patterns 302, and better reduces the voltage drop generated on the cathode layer 60, thereby better reducing the power consumption of the display substrate.

In some embodiments, the plurality of first sub-patterns 3021 are in one-to-one correspondence with at least part of the odd rows of sub-pixel region rows; or, the plurality of first sub-patterns 3021 are in one-to-one correspondence with at least part of the even rows of the sub-pixel region rows.

For example, the plurality of first sub-patterns 3021 are in one-to-one correspondence with all the odd rows of the sub-pixel region rows in the display substrate, and at least part of the first sub-patterns 3021 are in corresponding odd rows of the sub-pixel region rows.

For example, the plurality of first sub-patterns 3021 are in one-to-one correspondence with all the even rows of the sub-pixel region rows in the display substrate, and at least part of the first sub-patterns 3021 are located in the corresponding even rows of the sub-pixel region rows.

The above-mentioned arrangement enables the plurality of first sub-patterns 3021 to be uniformly distributed over the entire display region 70, better reducing the voltage drop generated on the cathode layer 60, and thus better reducing the power consumption of the display substrate.

In some embodiments, the plurality of second sub-patterns 3022 are divided into the plurality of rows of second sub-patterns 3022, the plurality of rows of second sub-patterns 3022 are correspond one-to-one with at least part of the sub-pixel region rows, and at least part of each second sub-pattern 3022 included in each row of second sub-patterns 3022 is located in the corresponding sub-pixel region rows.

For example, the plurality of rows of second sub-patterns 3022 are in one-to-one correspondence with the plurality of rows of sub-pixel region rows included in the display substrate, and at least a part of each second sub-pattern 3022 included in each row of second sub-patterns 3022 is located in the corresponding sub-pixel region rows.

The above-mentioned arrangement are beneficial to the uniform layout of the second conductive patterns 302, and better reduces the voltage drop generated on the cathode layer 60, thereby better reducing the power consumption of the display substrate.

In some embodiments, the plurality of rows of second sub-patterns 3022 are in one-to-one correspondence with at least part of the odd rows of sub-pixel region rows; or, the plurality of rows of the second sub-patterns 3022 are in one-to-one correspondence with at least part of the even rows of the sub-pixel region rows.

For example, the plurality of rows of the second sub-patterns 3022 are in one-to-one correspondence with all the odd rows of the sub-pixel region rows in the display substrate, and at least a part of each of the second sub-patterns 3022 included in each row of the second sub-patterns 3022 is located in the corresponding odd rows of the sub-pixel region rows.

For example, the plurality of rows of the second sub-patterns 3022 are in one-to-one correspondence with all the even rows of the sub-pixel region rows in the display substrate, and at least part of each of the second sub-patterns 3022 included in each row of the second sub-patterns 3022 is located in the corresponding even rows of the sub-pixel region rows.

The above-mentioned arrangement enables the plurality of second sub-patterns 3022 to be uniformly distributed over the entire display region 70, better reducing the voltage drop generated on the cathode layer 60, and thus better reducing the power consumption of the display substrate.

In some embodiments, the plurality of second sub-patterns 3022 are divided into the plurality of columns of second sub-patterns 3022, the plurality of columns of second sub-patterns 3022 are in one-to-one correspondence with at least part of the sub-pixel region columns, and at least part of each second sub-pattern 3022 included in each column of second sub-patterns 3022 is located in the corresponding sub-pixel region columns.

For example, the plurality of columns of the second sub-patterns 3022 are in one-to-one correspondence with the plurality of columns of the sub-pixel region columns in the display substrate, and at least a part of each of the second sub-patterns 3022 included in each column of the second sub-patterns 3022 is located in the corresponding sub-pixel region columns.

The above-mentioned arrangement are beneficial to the uniform layout of the second conductive patterns 302, and better reduces the voltage drop generated on the cathode layer 60, thereby better reducing the power consumption of the display substrate.

In some embodiments, the plurality of columns of second sub-patterns 3022 are in one-to-one correspondence with at least part of the odd columns of sub-pixel region columns; or, the plurality of columns of the second sub-patterns 3022 are in one-to-one correspondence with at least part of the even columns of sub-pixel region columns.

For example, the plurality of columns of the second sub-patterns 3022 are in one-to-one correspondence with all the odd columns of the sub-pixel region columns in the display substrate, and at least a part of each of the second sub-patterns 3022 included in each column of the second sub-patterns 3022 is located in the corresponding odd columns of the sub-pixel region columns.

For example, the plurality of columns of the second sub-patterns 3022 are in one-to-one correspondence with all the even columns of the sub-pixel region columns in the display substrate, and at least a part of each of the second sub-patterns 3022 included in each column of the second sub-patterns 3022 is located in the corresponding even columns of the sub-pixel region columns.

The above-mentioned arrangement enables the plurality of second sub-patterns 3022 to be uniformly distributed over the entire display region 70, better reducing the voltage drop generated on the cathode layer 60, and thus better reducing the power consumption of the display substrate.

In some embodiments, the plurality of first conductive patterns 301 are divided into the plurality of rows of first conductive patterns 301, the plurality of rows of first conductive patterns 301 are in one-to-one correspondence with at least part of the sub-pixel region rows, and at least part of each first conductive pattern 301 included in each row of first conductive patterns 301 is located in corresponding sub-pixel region rows.

For example, the plurality of rows of the first conductive patterns 301 are in one-to-one correspondence with the plurality of rows of the sub-pixel region rows in the display substrate, and at least a part of each of the first conductive patterns 301 included in each row of the first conductive patterns 301 is located in the corresponding sub-pixel region rows.

The above-mentioned arrangement is beneficial to the uniform layout of the first conductive patterns 301, can better reduce the IR-drop generated on the power supply layer 20, and effectively improve the LRU effect of the display substrate.

In some embodiments, the plurality of rows of the first conductive patterns 301 are in one-to-one correspondence with at least part of the odd rows of sub-pixel region rows; or, the plurality of rows of the first conductive patterns 301 are in one-to-one correspondence with at least part of the even rows of the sub-pixel region rows.

For example, the plurality of rows of the first conductive patterns 301 are in one-to-one correspondence with all odd rows of the sub-pixel region rows in the display substrate, and at least a part of each of the first conductive patterns 301 included in each row of the first conductive patterns 301 is located in the corresponding odd rows of the sub-pixel region rows.

For example, the plurality of rows of the first conductive patterns 301 are in one-to-one correspondence with all the even rows of sub-pixel region rows in the display substrate, and at least a part of each of the first conductive patterns 301 included in each row of the first conductive patterns 301 is located in the corresponding even rows of the sub-pixel region rows.

The above-mentioned arrangement enables the first conductive patterns 301 to be uniformly distributed over the entire display region 70, enables the IR-drop generated on the power supply layer 20 to be better reduced, and effectively improves the LRU effect of the display substrate.

In some embodiments, the plurality of first conductive patterns 301 are divided into the plurality of columns of first conductive patterns 301, the plurality of columns of first conductive patterns 301 are in one-to-one correspondence with at least part of sub-pixel region columns, and at least part of each first conductive pattern 301 included in each column of first conductive patterns 301 is located in the corresponding sub-pixel region columns.

For example, the plurality of columns of the first conductive patterns 301 are in one-to-one correspondence with the plurality of columns of the sub-pixel region columns in the display substrate, and at least a part of each of the first conductive patterns 301 included in each column of the first conductive patterns 301 is located in the corresponding sub-pixel region columns.

The above-mentioned arrangement is beneficial to the uniform layout of the first conductive patterns 301, can better reduce the IR-drop generated on the power supply layer 20, and effectively improve the LRU effect of the display substrate.

In some embodiments, the plurality of columns of first conductive patterns 301 are in one-to-one correspondence with at least part of the odd columns of sub-pixel region columns; or, the plurality of columns of the first conductive patterns 301 are in one-to-one correspondence with at least part of the even columns of the sub-pixel region columns.

For example, the plurality of columns of the first conductive patterns 301 are in one-to-one correspondence with all the odd columns of the sub-pixel region columns in the display substrate, and at least a part of each of the first conductive patterns 301 included in each column of the first conductive patterns 301 is located in the corresponding odd columns of the sub-pixel region columns.

For example, the plurality of columns of the first conductive patterns 301 are in one-to-one correspondence with all the even columns of the sub-pixel region columns in the display substrate, and at least a part of each of the first conductive patterns 301 included in each column of the first conductive patterns 301 is located in the corresponding even columns of sub-pixel region columns.

The above-mentioned arrangement enables the first conductive patterns 301 to be uniformly distributed over the entire display region 70, enables the IR-drop generated on the power supply layer 20 to be better reduced, and effectively improves the LRU effect of the display substrate.

In some embodiments, the display substrate further includes the thin film transistor array layer, wherein the thin film transistor array layer includes a thin film transistor, and the source electrode and the drain electrode of the thin film transistor are arranged in the same layer and are made of the same material as the power source layer 20.

For example, the first source drain metal layer in the display substrate is used to form the source and drain electrodes of the thin film transistor and the power layer 20.

The above-mentioned arrangement enables that the source electrode and the drain electrode of the thin film transistor and the power supply layer 20 can be formed in the same patterning process, which is beneficial to simplify the manufacturing process flow of the display substrate and reduce the manufacturing cost of the display substrate.

The embodiments of the present disclosure also provide the display device which includes the display substrate provided by the above embodiments.

It should be noted that the display device can be any product or component with display function such as television, display, digital photo frame, mobile phone, tablet computer, etc.

For example, the display device includes a medium-large size product such as NB. For example, the display device includes an organic light emitting diode display product.

In the display substrate provided by the above embodiment, the conductive layer is provided between the power source layer and the cathode layer, and the conductive layer includes the first conductive patterns and the second conductive patterns which are insulated from each other. By arranging that the first conductive patterns in the conductive layer are coupled to the power source layer, the IR-drop of the positive power signal transmitted by the power source layer is effectively reduced, which ensures a better LRU effect. By arranging that the second conductive patterns in the conductive layer are coupled to the cathode layer such that the second conductive patterns act as an auxiliary cathode, the resistance of the cathode layer is effectively reduced, which reduces the power consumption of the display substrate. Therefore, the display substrate provided by the above-described embodiments of the present disclosure ensures that the display substrate has the better LRU effect while reducing the power consumption of the display substrate by rationally distributing the conductive layer.

The display device provided by the embodiments of the present disclosure also has the above-mentioned advantageous effects when the above-mentioned display substrate is included, and will not be described in detail herein.

It should be noted that the "same layer" of the embodiments of the present disclosure can refer to a film layer on the same structural layer. Or, for example, the film layer in the same layer can be a layer structure formed by forming the film layer for forming a specific pattern using the same film forming process and then patterning the film layer by one patterning process using the same mask plate. Depending on the different particular pattern, a single patterning process can include multiple exposure, development, or etching processes, and the particular patterns in the resulting layer structure can or cannot be continuous. The particular patterns can also be at different heights or have different thicknesses.

In the various method in the embodiments of the present disclosure, the sequence number of each step cannot be used to define the order of each step, and for a person of ordinary skill in the art, without involving any inventive effort, it is also within the scope of the present disclosure to change the order of each step.

It should be understood that each of the embodiments described in the specification is intended to be presented in an enabling manner, similar elements can be referenced throughout the various embodiments, and each of the embodiments is intended to cover variations from the other embodiments. Particularly, the method embodiments are similar to product embodiments, and therefore are described briefly. For a related part, references can be made to some descriptions in the product embodiments.

Unless defined otherwise, technical or scientific terms used in the present disclosure should have the ordinary meaning as understood by one of ordinary skill in the art to which the disclosure belongs. The use of "first", "second", and the like in this disclosure do not represent any order, quantity, or importance, but are just to distinguish different components. The word "comprises" or "includes", and the like, mean that the presence of an element or item preceding the word covers the presence of the element or item listed after the word and equivalents thereof, but does not exclude other elements or items. "Connect", "coupled", and "mutually connected" or similar words are not limited to PHY or mechanical connection but may include electrical connection, either direct or indirect. The terms "upper", "lower", "left", "right" and the like are used only to indicate relative positional relationships that may change accordingly when the absolute position of the object being described changes.

It can be understood that when an element such as a layer, film, area or substrate is referred to as being "upper" or "lower" located on the other element, it can be "directly upper" or "lower" located on the other element or intervening elements may be present.

In the description of the embodiments above, particular features, structures, materials, or characteristics can be combined in any suitable manner in any one or more embodiments or examples.

The above embodiments are merely specific implementation modes of the present disclosure, but the scope of protection of the present disclosure is not limited thereto, and any modification and substitution be apparent to those skilled in the art without departing from the technical scope of the present disclosure shall covered by the scope protection of the present disclosure. Therefore, the scope of protection of the disclosure shall be subject to the scope of protection of the claims.

The invention claimed is:

1. A display substrate, comprising: a substrate, and a power source layer, a conductive layer, and a cathode layer which are sequentially stacked on the substrate in a direction away from the substrate, wherein
   the conductive layer comprises first conductive patterns and second conductive patterns insulated from each other, the first conductive patterns are coupled to the power source layer, and the second conductive patterns are coupled to the cathode layer;
   wherein the conductive layer comprises a plurality of first conductive patterns independent from each other; the plurality of first conductive patterns are respectively coupled with the power layer; and the second conductive patterns are in a grid form;
   wherein the plurality of first conductive patterns are divided into at least one row of first conductive patterns, each row of first conductive patterns comprise at least one first conductive pattern arranged in a first direction, the first conductive pattern comprise at least a portion extending in a second direction, and the second direction intersects the first direction.

2. The display substrate according to claim 1, wherein two adjacent rows of the first conductive patterns are staggered in the first direction.

3. The display substrate according to claim 1, wherein adjacent first conductive patterns in the first direction have first spacing region between them, and adjacent first conductive patterns in the second direction have second spacing region between them, and the second conductive patterns comprise portions in the first spacing region and/or portions in the second spacing region.

4. The display substrate according to claim 3, wherein the second conductive patterns comprise a plurality of first sub-patterns comprising a portion extending in the first direction and a plurality of second sub-patterns comprising a portion extending in the second direction;
   the plurality of first sub-patterns are arranged in the second direction, and adjacent first sub-patterns are coupled with each other via at least one of the second sub-patterns.

5. The display substrate according to claim 4, wherein
   the plurality of second sub-patterns are divided into a plurality of rows of second sub-patterns, the first sub-patterns and a row of the second sub-patterns are alternatively arranged in the second direction, and the second sub-patterns are coupled with the adjacent first sub-patterns.

6. The display substrate according to claim 4, wherein
   the first sub-patterns comprise a portion located between two adjacent rows of first conductive patterns;
   in the plurality of second sub-patterns, the second sub-patterns described in the first part are located between the adjacent first conductive patterns in the first direction, and the second sub-patterns described in the second part are located between the adjacent first conductive patterns in the second direction.

7. The display substrate according to claim 4, wherein the first sub-patterns and a row of the first conductive patterns are staggered in the second direction.

8. The display substrate according to claim 4, wherein the display substrate further comprises a plurality of sub-pixel regions distributed in an array, a sub-pixel drive circuit is arranged in the sub-pixel region, and the plurality of sub-pixel regions are divided into a plurality of sub-pixel region rows and a plurality of sub-pixel region columns; each row of sub-pixel region rows comprises the plurality of sub-pixel regions arranged along the first direction, and each column of sub-pixel region columns comprises the plurality of sub-pixel regions arranged along the second direction;

the plurality of first sub-patterns are in one-to-one correspondence with at least part of the sub-pixel region rows, and at least part of the first sub-patterns are located in the corresponding sub-pixel region rows.

9. The display substrate according to claim 8, wherein the plurality of first sub-patterns are in one-to-one correspondence with at least part of the odd rows of the sub-pixel region rows; or the plurality of first sub-patterns are in one-to-one correspondence with at least part of the even rows of sub-pixel region rows.

10. The display substrate according to claim 8, wherein the plurality of second sub-patterns are divided into a plurality of rows of second sub-patterns, the plurality of rows of second sub-patterns are in one-to-one correspondence with at least part of the sub-pixel region rows, and at least part of each second sub-pattern included in each row of second sub-patterns are located in the corresponding sub-pixel region rows;

wherein the plurality of rows of second sub-patterns are in one-to-one correspondence with at least part of the odd rows of sub-pixel region rows; or, the plurality of rows of the second sub-patterns are in one-to-one correspondence with at least part of the even rows of sub-pixel region rows.

11. The display substrate according to claim 8, wherein the plurality of second sub-patterns are divided into a plurality of columns of second sub-patterns, wherein the plurality of columns of second sub-patterns are in one-to-one correspondence with at least part of sub-pixel region columns, and at least part of each second sub-pattern included in each column of second sub-patterns are located in the corresponding sub-pixel region columns;

wherein the plurality of columns of second sub-patterns are in one-to-one correspondence with at least part of the odd columns of sub-pixel region columns; or, the plurality of columns of the second sub-patterns are in one-to-one correspondence with at least part of the even columns of sub-pixel region columns.

12. The display substrate according to claim 8, wherein the plurality of first conductive patterns are divided into a plurality of rows of first conductive patterns, and the plurality of rows of first conductive patterns are in one-to-one correspondence with at least part of the sub-pixel region rows, and at least part of each first conductive pattern included in each row of first conductive patterns are located in the corresponding sub-pixel region rows;

wherein the plurality of rows of the first conductive patterns are in one-to-one correspondence with at least part of the odd rows of the sub-pixel region rows; or, the plurality of rows of the first conductive patterns are in one-to-one correspondence with at least part of even rows of the sub-pixel region rows.

13. The display substrate according to claim 8, wherein the plurality of first conductive patterns are divided into a plurality of columns of first conductive patterns, and the plurality of columns of first conductive patterns are in one-to-one correspondence with at least part of the sub-pixel region columns, and at least part of each first conductive patterns included in each column of first conductive patterns are located in the corresponding sub-pixel region columns;

wherein the plurality of columns of first conductive patterns are in one-to-one correspondence with at least part of the odd columns of sub-pixel region columns; or, the plurality of columns of the first conductive patterns are in one-to-one correspondence with at least part of the even columns of the sub-pixel region columns.

14. The display substrate according to claim 1, wherein the plurality of first conductive patterns are divided into at least one column of first conductive patterns, each column of first conductive patterns comprise at least one of the first conductive patterns arranged in the second direction;

the power supply layer includes a plurality of power supply lines arranged in the first direction, wherein the power supply lines include the portion extending in the second direction; and each column of the first conductive patterns include a respective one of the first conductive patterns coupled to a corresponding one of the power supply lines;

wherein an orthographic projection of the first conductive patterns on the substrate and the corresponding orthographic projection of the power supply lines on the substrate have a first overlap region, wherein the first conductive patterns are coupled to the corresponding power supply lines via at least one first via-hole, and the orthographic projection of the at least one first via-hole on the substrate is located in the first overlap region.

15. The display substrate according to claim 1, wherein the display substrate further includes an anode layer located between the conductive layer and the cathode layer, wherein the anode layer includes a plurality of anode patterns with an anode spacing region between adjacent anode patterns;

an orthographic projection of the second conductive patterns on the substrate and the orthographic projection of the anode spacing region on the substrate have a second overlap region, wherein the second conductive patterns are coupled to the cathode layer through at least one second via-hole, the orthographic projection of the at least one second via-hole on the substrate is located in the second overlap region.

16. The display substrate according to claim 1, wherein the display substrate further comprises the anode layer located between the conductive layer and the cathode layer, wherein the anode layer comprises a first auxiliary connection pattern and a plurality of anode patterns, the anode spacing region is arranged between the adjacent anode patterns, the first auxiliary connection pattern is located in the anode spacing region, and the first auxiliary connection pattern is insulated from the anode patterns;

the second conductive patterns are coupled to the cathode layer through the first auxiliary connection pattern;

wherein the display substrate comprises a display region and a peripheral region surrounding the display region; the anode layer further comprises a second auxiliary connection pattern, wherein the second auxiliary connection pattern is located in the peripheral region;

the conductive layer further comprises a third conductive pattern, wherein the third conductive pattern is located in the peripheral region; the third conductive pattern is coupled to the cathode layer through the second auxiliary connection pattern, and the third conductive pattern is further coupled to the second conductive pattern.

17. The display substrate according to claim 1, wherein the display substrate further comprises a thin film transistor array layer, wherein the thin film transistor array layer comprises the thin film transistor, and the source electrode and the drain electrode of the thin film transistor are arranged in the same layer and are made of the same material as the power supply layer.

18. A display device comprising the display substrate according to claim 1.

* * * * *